United States Patent [19]
Takahashi

[11] Patent Number: 5,959,877
[45] Date of Patent: Sep. 28, 1999

[54] MASK ROM

[75] Inventor: Hiroshi Takahashi, Ohimachi, Japan

[73] Assignee: Texas Instruments Incorporated, Dallas, Tex.

[21] Appl. No.: 09/108,753

[22] Filed: Jul. 1, 1998

[30] Foreign Application Priority Data

Jul. 1, 1997 [JP] Japan ..................................... 9-176165

[51] Int. Cl.$^6$ ............................ G11C 17/00; G11C 17/12
[52] U.S. Cl. ............................. 365/104; 365/94; 257/390
[58] Field of Search ............................. 365/94, 104, 182, 365/184; 257/390, 391, 401

[56] References Cited

U.S. PATENT DOCUMENTS

| | | | |
|---|---|---|---|
| 5,426,605 | 6/1995 | Van Berkel et al. | 365/182 |
| 5,432,730 | 7/1995 | Shubat et al. | 365/63 |
| 5,600,586 | 2/1997 | Lee | 365/104 |
| 5,663,903 | 9/1997 | Guo | 365/104 |
| 5,812,448 | 9/1998 | Wen | 365/182 |

Primary Examiner—Son Mai
Attorney, Agent, or Firm—Richard L. Donaldson; William B. Kempler

[57] ABSTRACT

To realize a type of mask ROM which can minimize the increase in the area while shortening the manufacturing cycle time. Multiple ROM memory cells with memory data stored in them corresponding to the presence/absence of via contacts are set in a matrix configuration between different metal wiring layers; the memory cells of the same row are connected to the same word line, the memory cells of the same column are connected to the same bit line; in addition, on each memory cell row, the gates are connected to the word line corresponding to that row, and the diffusion layer is connected to the diffusion layer of the adjacent diffusion transistor. In the read mode, by precharging the selected bit line to the prescribed potential and by setting the selected word line in the active state, the transistors on the selected row are set in the conductive state, and, corresponding to the presence/absence of the via contact of the selected memory cell, the selected bit line potential is set, and the memory data of the selected memory cell can be read.

15 Claims, 3 Drawing Sheets

MASK ROM

FIELD OF THE INVENTION

This invention pertains to a type of mask ROM. More specifically, this invention pertains to a contact type or via contact type mask ROM which allows shortening of the cycle time of the manufacturing process.

BACKGROUND OF THE INVENTION

For the mask ROM, the memory data are loaded in the memory cells during manufacture. The data writing step is called programming or coding. Usually, the interval from the time when the coding data in the mask ROM are obtained from the user to the time of shipment of the product is called to cycle time, or TAT (turnaround time). For the ROM products, shortening the TAT is an important task from the viewpoint of the commercial value of the products and productivity.

Depending on the data coding method, the mask ROMs can be classified into the diffusion type, contact type and via contact type. For each of these methods, there is a trade-off relationship between the cycle time and the degree of integration. When the actual ROM products are manufactured, it is necessary to select the appropriate method corresponding to the characteristics and demands on the specific type of products.

FIG. 7 is a schematic cross-sectional view illustrating the concept of the mask ROM formed using the diffusion method.

In FIG. 7, 1 represents p⁻ substrates or p⁻ wells; 2-1, 2-2, 2-3, 2-4, 2-5 and 2-6 represent the n⁺ diffusion layers; 3-1, 3-2a, 3-3, 3-4a, and 3-5 represent insulating films; 4-1, 4-2, 4-3, 4-4, and 4-5 represent polysilicon films; and 5-1, 5-2, 5-3, 5-4, 5-5, and 5-6 represent metal wiring layers.

For example, insulating films 3-1, 3-2a, 3-3, 3-4a, and 3-5 may be made of silicon oxide film ($SiO_2$).

n⁺ diffusion layers 2-1, 2-2, 2-3, 2-4, 2-5, and 2-6 are connected through contacts to metal wiring layers 5-1, 5-2, 5-3, 5-4, 5-5, and 5-6.

In addition, n⁺ diffusion layers 2-1, 2-3, and 2-5 are grounded through metal wiring layers 5-1, 5-3, and 5-5 connected to them, respectively.

Polysilicon films 4-1, 4-2, 4-3, 4-4, and 4-5 are connected commonly to wiring not shown in the figure, and the wiring forms the word lines.

Also, metal wiring layers 5-2, 5-4, and 5-6 are connected to the bit lines, respectively.

For the diffusion type mask ROM of this invention, data coding is performed, for example, by means of oxidation processing at the periphery of the oxide film underneath a polysilicon film in order to set a large film thickness of the gate oxide film on a level with little function as transistors.

As shown in FIG. 7, for example, a gate transistor is formed from polysilicon film 4-1 and n⁺ diffusion layers 2-1 and 2-2 beneath the two sides of gate oxide film 3-1. When a high-level voltage is applied to polysilicon film 4-1 as gate, a channel is formed in the substrate region below gate oxide film 3-1. Consequently, the ON/OFF state of the transistor is under control corresponding to the voltage applied to gate 4-1.

On the other hand, for oxide film 3-2a underneath polysilicon film 4-2, as aforementioned, the film thickness is increased by means of oxidation processing. Consequently, even when a high voltage is applied to polysilicon film 4-2, there is still no channel formed in the substrate region below oxide film 3-2a, so that a transistor cannot be formed from polysilicon film 4-2 and n⁺ diffusion layers 2-2 and 2-3 formed in the substrate below the two sides of the polysilicon film.

Depending on whether a transistor is formed or not, the potential of the bit line is determined during reading. By detecting the bit line potential with a sense amplifier, it is possible to read the memory data in the memory cells of the mask ROM.

For such diffusion type mask ROM, data coding is performed by performing or not performing the oxidation processing for the periphery of the oxide film below the polysilicon layer. Consequently, the memory cells of the mask ROM formed can be made smaller, that is, the degree of integration of the memory can be increased. This is an advantage.

However, for the aforementioned mask ROM formed using the conventional diffusion method, as data coding is performed during the step of formation of the polysilicon layer, many steps of operation must be performed after coding and before formation of the mask ROM, and the cycle time becomes longer. This is a disadvantage.

On the other hand, when the mask ROM is formed using the contact method or via contact method, data coding is performed before the step of formation of the metal wiring layer. Consequently, before obtaining the coding data, it is possible to perform the manufacturing process for the polysilicon layer and the layers on it, such as the first or second metal layers if the process pertains to a 3-layer metal wiring operation. As a result, the cycle time of the manufacturing operation can be significantly shortened than that in the diffusion method. This is an advantage. In practice, the cycle time in manufacturing the mask ROM is only a fraction ($1/10$–$1/5$) of that of the diffusion method.

However, for the contact method or via contact method, while the cycle time can be shortened, the area occupied by each memory cell is nevertheless larger, that is, the degree of integration is lower, and the chip area is larger for the mask ROM with the same capacity. This is a disadvantage.

Consequently, when a high degree of integration is demanded, the diffusion method is adopted. In this case, the manufacturing cycle time becomes longer and the production efficiency goes down. On the other hand, when a shorter manufacturing cycle time is demanded, while there is certain margin for the demand on the degree of integration, the contact or via contact method is adopted.

Consequently, there is a demand for development of a type of high-performance mask ROM that has both the advantages of the diffusion type mask ROM and the advantages of the contact or via contact type mask ROM, that is, with both a shorter manufacturing cycle time and a high degree of integration.

The purpose of this invention is to solve the aforementioned problems of the conventional technology by providing a type of mask ROM which can minimize the increase in the area of the memory cells while shortening the manufacturing cycle time.

SUMMARY OF INVENTION

In order to realize the aforementioned purpose, this invention provides a type of mask ROM characterized by the following facts: the mask ROM has memory cells which store the prescribed data depending on whether contact is formed between first and second nodes, and which set the bit line potential corresponding to the presence/absence of said contact during the reading process so that the memory data are read corresponding to said bit line potential; in this mask ROM, there are: a memory cell array having multiplesaid memory cells set in an array configuration, multiplebit lines wired to the columns of said memory cell array, respectively, multipleword lines wired to the rows of said memory cell array, respectively, and multipletransistors which have their control electrodes connected to said word lines, respectively, and which are connected in series between prescribed potentials for said word lines, respectively, to control the ON/OFF state corresponding to said word line potential; the structure is such that the diffusion layers of adjacent transistors are connected to a common connecting node; the connecting node is connected to said first node of each said memory cell; said second node of said memory cell is connected to said bit line wired for each column of said memory cell array.

According to this invention, a preferable scheme has said word lines formed from a polysilicon layer, and said bit lines are formed from a metal wiring layer formed on said polysilicon layer, and that contact is formed between said metal wiring layer and said connecting node of each said transistor corresponding to the memory data of each said memory cell.

Also, according to this invention, a preferable scheme has, during the reading process, the selected bit line is kept at a prescribed precharge potential, and the unselected bit line is kept at a potential lower than said precharge potential, such as the ground potential, and that during the reading process, the selected bit line is kept at a potential which enables conduction of the transistor that has its control electrode connected to the selected word line, and the unselected bit line is kept at a potential lower than said read potential, such as the ground potential.

In addition, the mask ROM of this invention may have the following features: the mask ROM has memory cells which store the prescribed data depending on whether contact is formed between first and second potential setting nodes, and which set the bit line potential corresponding to the presence/absence of said contact during the reading process so that the memory data are read corresponding to said bit line potential; the mask ROM has the following structure: N (N is an integer other than 0) nodes are set in two columns between the first and second potential setting nodes; there are multipletransistors set between adjacent nodes of the same column or between said two columns; there are memory cell rows made of word lines connected commonly to the control electrodes of said transistors; said first and second potential setting nodes are connected to a common potential; said N nodes are connected to said first nodes of said N memory cells; and said second nodes of said memory cells are connected to N bit lines, respectively.

In addition, multiplesaid memory cell rows are set, and said first node of the ith (i=1, 2, ... N) memory cell of each memory cell row is connected to the ith bit line.

According to this invention, at the multiplenodes set between ground potentials, multipletransistors connected between adjacent nodes are formed. The control electrodes of these transistors are connected commonly to the same word line, such as the word line made of a polysilicon layer; and said nodes are connected through the memory cells of the ROM to bit lines made of a metal wiring layer formed on the polysilicon layer.

For each memory cell, by means of the coding operation corresponding to the write data, whether contact should be formed or not is determined. Consequently, in the read mode, the selected bit line is kept at the prescribed precharge potential, and the read potential is applied on the aforementioned word line, so that said multiplenodes are kept at ground potential, corresponding to the memory data of the selected memory cell, that is, the presence/absence of contact, the bit line potential is either kept at the precharge potential or is discharged to the ground potential; the bit line potential is detected by the sense amplifier connected to it, and, corresponding to the result of detection, the memory data of the selected memory cell is read.

As a result, it is possible to shorten the manufacturing cycle time of the mask ROM, and it is possible to realize a higher degree of integration.

Figure 1:
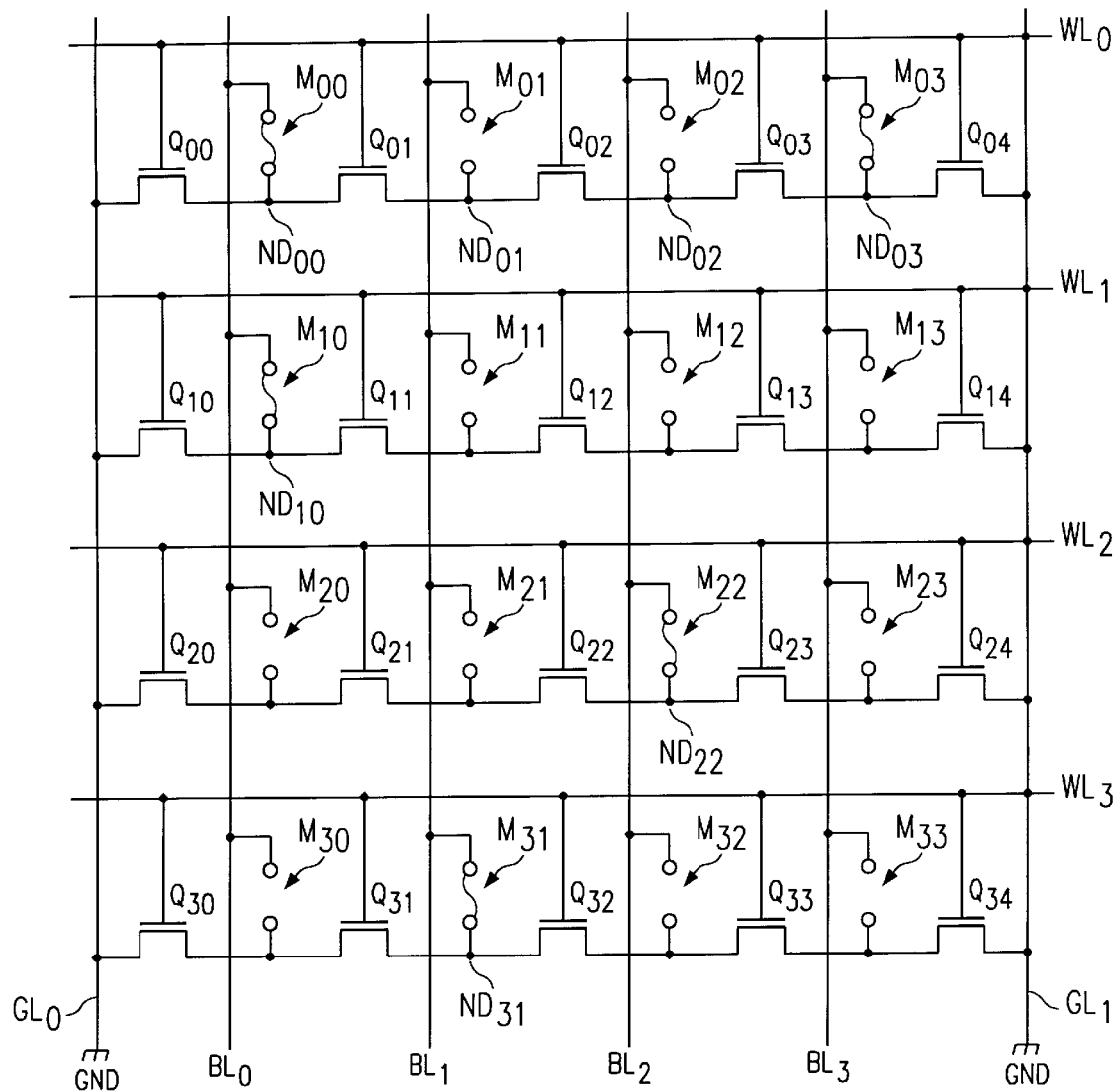
FIG. 1 is a circuit diagram illustrating Embodiment 1 of the mask ROM of this invention.

REFERENCE NUMERALS AND SYMBOLS AS SHOWN IN THE DRAWINGS 1 is substrate; 2-1, 2-2, 2-3, 2-4, 2-5, 2-6, 2-7, 2-8 is the $n^+$ diffusion layer, 3-1, 3-2, 3-3, 3-4, 3-5 is the Insulating film; 4-1, 4-2, 4-3, 4-4, 4-5 is the Polysilicon film; 5-1, 5-2, 5-3, 5-4, 5-5, 5-6 is the first metal wiring layer; 6-1, 6-2, 6-3, 6-4, 6-5, 6-6 is the second metal wiring layer; 7-1, 7-2, 7-3, 7-4, 7-5, 7-6 is the third metal wiring layer; 10-1, 10-2, 10-6, 11-2, 11-6 is the Via 12 is the polysilicon layer; 13-1, 13-2, 13-3, 13-4, 13-5, 13-6, 13-7, 13-8 is the contact hole, WL0, WL1, WL2, WL3, are word lines, BL0, BL1, BL2, BL3 is the bit lines; $M_{00}$, $M_{01}$, ... $M_{03}$ ... $M_{30}$, $M_{31}$ ... $M_{33}$ ... are memory cells; $Q_{00}$, $Q_{01}$, ... $Q_{04}$ ... $Q_{30}$, $Q_{31}$ ... $Q_{34}$ ..., are transistors, Vcc, is power source voltage; and GND is ground potential.

DESCRIPTION OF EMBODIMENTS

Embodiment 1

FIG. 1 is a circuit diagram illustrating Embodiment 1 of the mask ROM of this invention. It is an equivalent circuit diagram of the mask ROM of this invention.

As shown in the figure, the mask ROM in this embodiment has parallel set word lines WL0, WL1, WL2, WL3 and bit lines BL0, BL1, BL2 BL3 cross said set word lines. At the cross points between said word lines and bit lines, memory cells $M_{00}$, $M_{01}$, ... $M_{03}$, ... $M_{30}$, $M_{31}$, ... $M_{33}$, which store the data (also known as code) by means of the presence/absence of via contact are set in a matrix configuration. In addition, multipletransistors $Q_{00}$, $Q_{01}$, ... $Q_{04}$, ... $Q_{30}$, $Q_{31}$, ... $Q_{34}$ are formed, with gates connected to the word lines, and source and drain diffusion layers connected to the bit lines wired adjacent to them.

Also, a ground line is set at intervals of 4 bit lines. For example, ground line GL0 is set adjacent to bit line BL0, and ground line GL1 is set adjacent to bit line BL3. Corresponding to this, for example, for transistors $Q_{00}$, $Q_{10}$, $Q_{20}$, and $Q_{30}$, the diffusion layer on one side is connected to ground line GL0, while the diffusion layer on the other side is connected to bit line BL0. Similarly, for transistors $Q_{04}$, $Q_{14}$, $Q_{24}$, and $Q_{34}$, the diffusion layer on one side is connected to bit line BL3, and the diffusion layer on the other side is connected to ground line GL1.

In the example of the mask ROM shown in FIG. 1, 4 word lines and 4 bit lines are set. However, in the practical mask ROM, the numbers are not limited to it. For example, a single ROM block may be a 4 Kb (kilobits) memory block comprising 256 word lines and 16 bit lines.

As aforementioned, in the mask ROM of this example, memory cells $M_{00}$, $M_{01}$ ... $M_{03}$ ... $M_{30}$ ... $M_{31}$ ... $M_{33}$ are set, with the accomodated data determined by the presence/absence of via contact (referred to as via hereinafter).

For example, as shown in the figure, via is connected between bit line BL0 and the connecting point (represented by node $ND_{00}$) of the diffusion layers of transistors $Q_{00}$ and $Q_{01}$. Corresponding to this, an electrical path is formed between bit line BL0 and node $ND_{00}$, and, corresponding to the bias state, a current may flow between bit line BL0 and node $ND_{00}$.

On the other hand, suppose the connecting point between the diffusion layers of transistors $Q_{01}$ and $Q_{02}$ is node $ND_{01}$, a via is not formed between bit line BL1 and node $ND_{01}$, and current cannot flow between bit line BL1 and node $ND_{01}$, irrespective of the bias condition.

In addition, as shown in the figure, a via is also formed between bit line BL0 and node $ND_{10}$, between bit line BL1 and node $ND_{31}$, between bit line BL2 and node $ND_{22}$, and between bit line BL3 and node $ND_{03}$.

In this way, for the mask ROM of this embodiment, as it is a mask ROM using the via contact method, it is possible to seek shortening of the manufacturing cycle time. For example, the operation of formation of the polysilicon layer and the first and second metal wiring layers on the polysilicon layer is performed beforehand. Then, after the write data of the memory cells are obtained, the remaining steps are performed for data coding so as to form the mask ROM. Consequently, the manufacturing cycle time can be shortened significantly compared to that of the conventional diffusion type mask ROM.

In the following, with reference to FIG. 1, the reading operation of the mask ROM in this embodiment will be explained.

In the read mode, first of all, by means of a column decoder, the memory column assigned by the column address is selected. Corresponding to this, the bit line is equalized, for example, it is precharged to the prescribed potential. In addition, by means of a row decoder, the memory row assigned by the row address is selected. Corresponding to this, the read voltage, such as a high-level voltage, is applied on the word line.

Also, the unselected word lines and bit lines are kept on a low level, such as ground potential GND.

In this case, for example, by means of the column decoder, bit line BL0 is equalized and precharged. Then, by means of the row decoder, word line WL0 is selected, and a high-level read potential is applied. In this case, the read potential is set at a potential that can sufficiently ensure conduction of transistors $Q_{00}$, $Q_{01}$ ... $Q_{04}$ ... $Q_{30}$, $Q_{31}$ ... $Q_{34}$ that form the mask ROM.

Corresponding to this, all of the transistors $Q_{00}$, $Q_{01}$, ... $Q_{04}$ connected to word line WL0 are kept in the conductive state. As a result, nodes $ND_{00}$, $ND_{01}$, $ND_{02}$, and $ND_{03}$ are kept at ground potential GND. As aforementioned, a via is formed between bit line BL0 and node $ND_{00}$, bit line BL0 is discharged, and its potential decreases to reach ground potential GND.

The potential of bit line BL0 is detected by the sense amplifier connected to the bit line, and, corresponding to the detection result, data are output. In this case, for example, corresponding to the low-level potential of bit line BL0, read datum "0" is output. That is, by forming a via between bit line BL0 and node $ND_{00}$, the accomodated datum in memory cell $M_{00}$ is set to "0."

Subsequently, by means of a column decoder, for example, bit line BL1 is equalized and precharged. Subsequently, by means of the row decoder, word line WL0 is selected, and a high-level read potential is applied. Corresponding to this, all of the transistors $Q_{00}$, $Q_{01}$, ... $Q_{04}$ connected to word line WL0 are kept in the conductive state, and nodes ND00, ND01, ND02, and ND03 are grounded.

As a via is formed between bit line BL1 and node ND01, the precharge potential of bit line BL1 is nearly kept at the precharge potential. By means of a sense amplifier, the potential of bit line BL1 is detected, and, corresponding to the detection result, data are output. In this case, for example, corresponding to the low-level potential of bit line BL1, read datum "1" is output. That is, by forming a via between bit line BL1 and node $ND_{01}$, the accomodated datum in memory cell $M_{01}$ is set to "1."

In the same way as aforementioned, by selecting the bit line and word line, it is possible to read the stored data in any memory cell.

Also, formation of the via is determined corresponding to, say, the pattern of the photoresist film, in the process of manufacturing the mask ROM. That is, corresponding to the data to be stored in the mask ROM, the pattern of the photoresist is designed beforehand. By means of the manufacturing process using the photoresist film, whether a via is formed in the prescribed region or not is determined. In this way, the desired data are written in the mask ROM.

Figure 2:
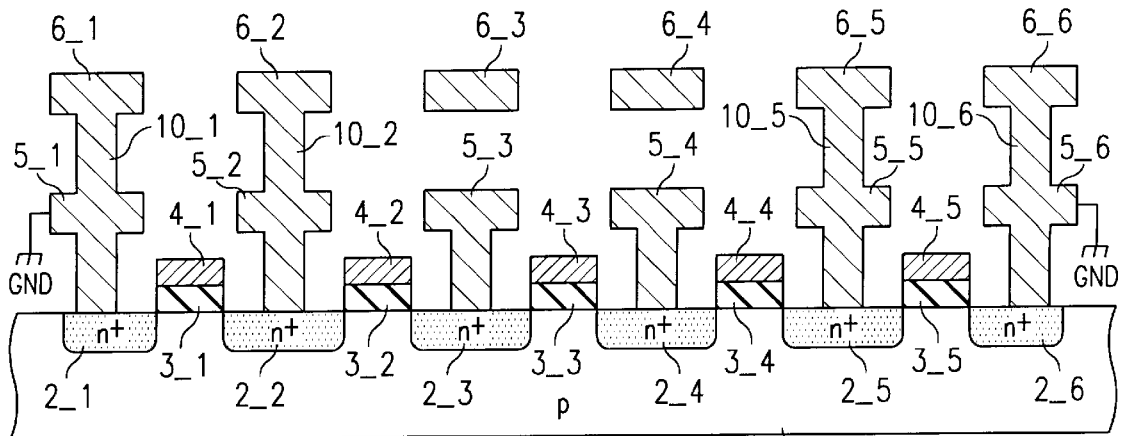
FIG. 2 is a schematic cross-sectional view illustrating the structure of the mask ROM having two metal wiring layers.

FIG. 2 is a schematic cross-sectional view illustrating the structure of the mask ROM in this embodiment.

In FIG. 2, 1 represents p⁻ substrates or p⁻ wells; 2-1, 2-2, 2-3, 2-4, 2-5 and 2-6 represent the n⁺ diffusion layers; 3-1, 3-2, 3-3, 3-4, and 3-5 represent insulating films; 4-1, 4-2, 4-3, 4-4, and 4-5 represent polysilicon films; 5-1, 5-2, 5-3, 5-4, 5-5, and 5-6 represent first metal wiring layers; 6-1, 6-2, 6-3, 6-4, 6-5, and 6-6 represent second metal wiring layers; and 10-1, 10-2, 10-5, 10-6 represent vias.

For example, insulating films 3-1, 3-2, 3-3, 3-4, and 3-5 may be made of silicon oxide film. For example, vias 10-1, 10-2, 10-5, and 10-6 are formed from the same material as that for forming the metal wiring layers.

Also, for example, FIG. 1 illustrates a row of the mask ROM shown in FIG. 1.

Using polysilicon films 4-1, 4-2, 4-3, 4-4, and 4-5, insulating films 3-1, 3-2, 3-3, 3-4, and 3-5, and the n⁺ diffusion layers formed in the substrate below the two sides of these films, n channel MOS transistors (referred to as nMOS transistors hereinafter) are formed. The polysilicon film forms the gate of the nMOS transistor, the insulating film forms the gate insulating film of the transistor (also called gate oxide film), and the n⁺ diffusion layers formed on substrate 1 become the source and drain of the nMOS transistor.

n⁺ diffusion layers 2-1, 2-2, 2-3, 2-4, 2-5, and 2-6 are connected through vias to first metal wiring layers 5-1, 5-2, 5-3, 5-4, 5-5, and 5-6, respectively.

In addition, n⁺ diffusion layers 2-1 and 2-6 are grounded through first metal wiring layers 5-1 and 5-6 connected to them, respectively.

Polysilicon films 4-1, 4-2, 4-3, 4-4, and 4-5 are connected commonly to wiring not shown in the figure, and the wiring forms the word lines.

Second metal wiring layers 6-2, 6-3, 6-4, and 6-5 form bit lines BL0, BL1, BL2, and BL3, respectively. Bit lines BL0 and BL3 are connected to n⁺diffusion layers 2-2 and 2-5 through vias 10-2 and 10-5 formed between first and second metal wiring layers, respectively.

As explained above, whether vias are formed or not depends on the pattern of the photoresist film used in the manufacturing operation. Corresponding to the presence/absence of vias, "0" or "1" data are stored in the memory cell of the mask ROM. In the read mode, corresponding to the presence/absence of vias, the bit line potential is kept at the precharge level or a level lower than the precharge level, such as ground potential GND. By detecting the bit line potential using a sense amplifier, it is possible to read the memory data of the memory cell of the mask ROM.

Figure 3:
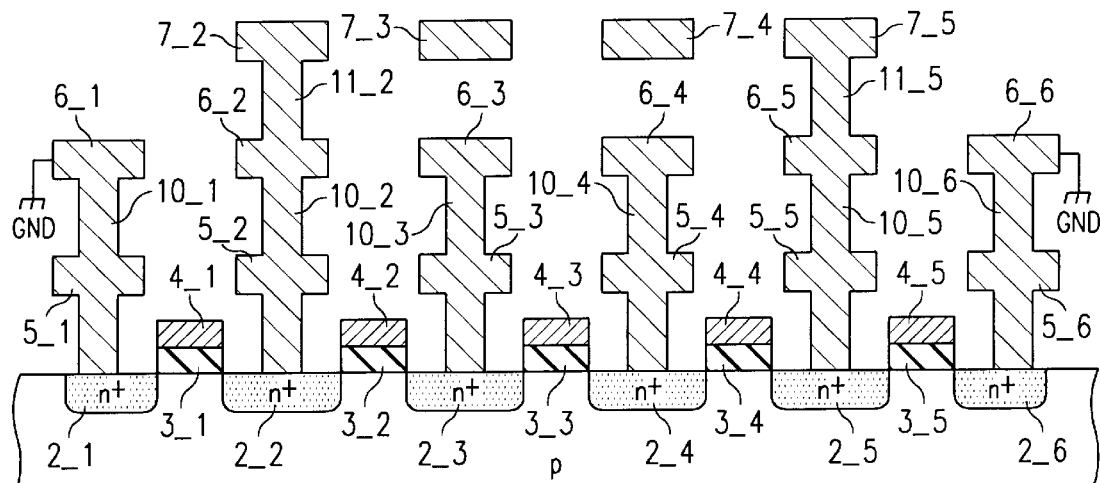
FIG. 3 is a schematic cross-sectional view illustrating the structure of the mask ROM having three metal wiring layers.

FIG. 3 is a schematic cross-sectional view illustrating another example of structure of the mask ROM in this embodiment.

The mask ROM in this example differs from the mask ROM shown in FIG. 2 in that it also has third metal wiring layers 7-2, 7-3, 7-4, and 7-5.

Except for the third metal wiring layers, the other structural parts are nearly identical to those of the mask ROM shown in FIG. 2. Consequently, the same part numbers as those in FIG. 2 are adopted to represent the same structural parts.

In the following, explanation will be made on the points of the mask ROM in this example different from the mask ROM shown in FIG. 2.

As shown in FIG. 3, vias 10-1 . . . 10-6 are formed between first metal wiring layers 5-1 . . . 5-6 and second metal wiring layers 6-1 . . . 6-6. In addition, via 11-2 is formed between second metal wiring layer 6-2 and third metal wiring layer 7-2, and via 11-5 is formed between second metal wiring layer 6-5 and third metal wiring layer 7-5.

Also, these vias are formed from a material that can facilitate connection of the first, second and third metal wiring layers.

For example, second metal wiring layers 6-1 and 6-6 are kept at ground potential GND. Consequently, n⁺ diffusion layer 2-1 on substrate (1) is grounded through first metal wiring layer 5-1 and second metal wiring layer 6-1. Similarly, n⁺ diffusion layer 2-6 is connected to ground through first metal wiring layer 5-6 and second metal wiring layer 6-6.

Just as in FIG. 2, FIG. 3 illustrates a row of the mask ROM shown in FIG. 1.

Using polysilicon films 4-1, 4-2, 4-3, 4-4, and 4-5, insulating films 3-1, 3-2, 3-3, 3-4, and 3-5, and the n⁺ diffusion layers formed in the substrate below the two sides of these films, nMOS transistors are formed. The polysilicon film forms the gate of the nMOS transistor, the insulating film forms the gate insulating film of the transistor, and the n⁺ diffusion layers formed on substrate 1 become the source and drain of the nMOS transistor.

n⁺ diffusion layers 2-1, 2-2, 2-3, 2-4, 2-5, and 2-6 are connected through vias to first metal wiring layers 5-1, 5-2, 5-3, 5-4, 5-5, and 5-6, respectively.

In addition, n⁺ diffusion layers 2-1 and 2-6 are grounded through first metal wiring layers 5-1 and 5-6, vias 10-1 and 10-6, and second metal wiring layers 6-1 and 6-6 connected to them, respectively.

Polysilicon films 4-1, 4-2, 4-3, 4-4, and 4-5 are connected commonly to wiring not shown in the figure, and the wiring forms the word lines.

Third metal wiring layers 7-2, 7-3, 7-4, and 7-5 form bit lines BL0, BL1, BL2, and BL3, respectively. Bit lines BL0 and BL3 are connected to n⁺ diffusion layers 2-2 and 2-5 through vias 11-2 and 11-5 formed between first, second and third metal wiring layers, respectively.

Also, just as in the example of mask ROM shown in FIG. 2, whether vias are formed between the metal wiring layers depends on the pattern of the photoresist film used in the manufacturing operation. Corresponding to the presence/absence of vias, "0" or "1" data are stored in the memory cell of the mask ROM. In the read mode, corresponding to the presence/absence of vias, the bit line potential is kept at the precharge level or a level lower than the precharge level, such as ground potential GND. By detecting the bit line potential using a sense amplifier, it is possible to read the memory data of the memory cell of the mask ROM.

As explained above, it can be concluded that the mask ROM having two metal wiring layers and that having three metal wiring layers have nearly the same function and the same operation, except the difference in their structures.

The number of the metal wiring layers depends on the number of the metal wiring layers needed for forming the peripheral circuit of the mask ROM. For the practical mask ROM, the number of the metal wiring layers is not limited to said two or three. It is also possible to set more metal wiring layers.

FIG. 4 shows the equivalent circuit in the read mode of the mask ROM shown in FIG. 1.

Here, for example, the read operation for memory cells $M_{00}$, $M_{01}$, $M_{02}$, and $M_{03}$ as a row connected to word line WL0 shown in FIG. 1 with respect to bit lines BL0, BL1, BL2, and BL3 is performed with an equivalent circuit shown in FIGS. 1(a)–(d).

Figures 4A, 4B, 4C, 4D:
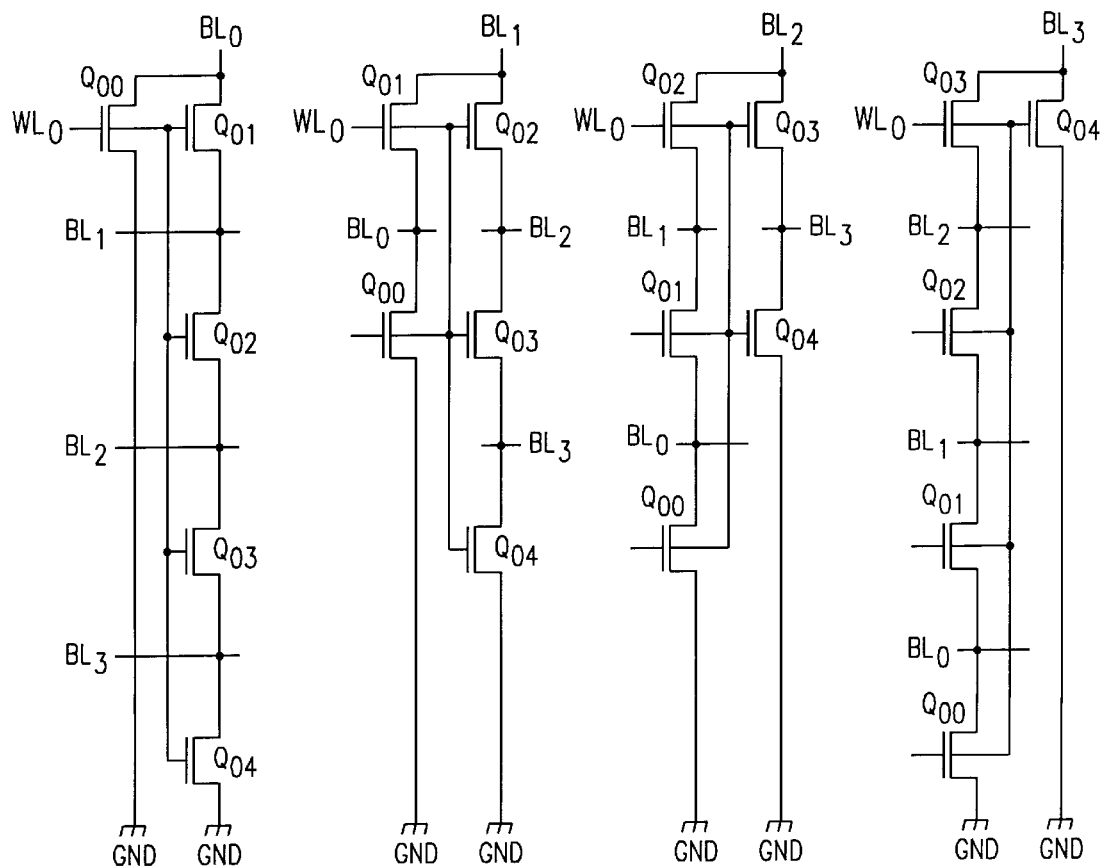
FIG. 4 is an equivalent circuit in the read mode in embodiment of the mask ROM.

FIG. 4(a) illustrates the equivalent circuit viewed from bit line BL0 in the read mode when a via is formed at memory cell M00.

As shown in the figure, five transistors $Q_{00}$, $Q_{01}$, $Q_{02}$, $Q_{03}$, and $Q_{04}$, the gates of which are connected to word line WL0, are connected between bit line BL0 and ground potential GND.

Transistor $Q_{00}$ is connected between bit line BL0 and ground potential GND. Transistors $Q_{01}$, $Q_{02}$, $Q_{03}$, and $Q_{04}$ are connected in series between bit line BL0 and ground potential GND.

Bit line BL1 is connected between transistors $Q_{01}$ and $Q_{02}$; bit line BL2 is connected between transistors $Q_{02}$ and $Q_{03}$; and bit line BL3 is connected between transistors $Q_{03}$ and $Q_{04}$. In the read mode, these unselected bit lines are kept at ground potential GND.

FIG. 4(b) illustrates the equivalent circuit viewed from bit line BL1 in the read mode when a via is formed at memory cell As shown in the figure, five transistors $Q_{00}$, $Q_{01}$, $Q_{02}$, $Q_{03}$, and $Q_{04}$, the gates of which are connected to word line WL0, are connected between bit line BL1 and ground potential GND.

Transistors $Q_{01}$ and $Q_{00}$ are connected in series between bit line BL1 and ground potential GND, and transistors $Q_{02}$, $Q_{03}$, and $Q_{04}$ are connected in series between bit line BL1 and ground potential GND.

Bit line BL0 is connected between transistors $Q_{01}$ and $Q_{00}$; bit line BL2 is connected between transistors $Q_{02}$ and $Q_{03}$; and bit line BL3 is connected between transistors $Q_{03}$ and $Q_{04}$ In the read mode, these unselected bit lines are kept at ground potential GND.

FIG. 4(c) illustrates the equivalent circuit viewed from bit line BL2 in the read mode when a via is formed at memory cell M02.

As shown in the figure, five transistors $Q_{00}$, $Q_{01}$, $Q_{02}$, $Q_{03}$, and $Q_{04}$, the gates of which are connected to word line WL0, are connected between bit line BL2 and ground potential GND.

Transistors $Q_{02}$, $Q_{01}$, and $Q_{00}$ are connected in series between bit line BL2 and ground potential GND, and transistors $Q_{03}$ and $Q_{04}$ are connected in series between bit line BL2 and ground potential GND.

Bit line BL1 is connected between transistors $Q_{02}$ and $Q_{01}$; bit line BL3 is connected between transistors $Q_{01}$ and $Q_{00}$; and bit line BL3 is connected between transistors $Q_{03}$ and $Q_{04}$. In the read mode, these unselected bit lines are kept at ground potential GND.

FIG. 4(d) illustrates the equivalent circuit viewed from bit line BL3 in the read mode when a via is formed at memory cell $M_{03}$ As shown in the figure, five transistors $Q_{00}$, $Q_{01}$, $Q_{02}$, $Q_{03}$, and $Q_{04}$, the gates of which are connected to word line WL0, are connected between bit line BL3 and ground potential GND.

Transistor $Q_{04}$ is connected in series between bit line BL3 and ground potential GND, and transistors $Q_{00}$, $Q_{01}$, $Q_{02}$, and $Q_{03}$ are connected in series between bit line BL3 and ground potential GND.

Bit line BL2 is connected between transistors $Q_{03}$ and $Q_{02}$; bit line BL1 is connected between transistors $Q_{02}$ and $Q_{01}$; and bit line BL0 is connected between transistors $Q_{01}$ and $Q_{00}$. In the read mode, these unselected bit lines are kept at ground potential GND.

As can be seen from the aforementioned equivalent circuit, in the read mode for any of bit lines BL0, BL1, BL2, and BL3, dispersion in the equivalent resistance of the discharge current in the read mode is suppressed to a low level corresponding to the configuration of the read bit lines.

For example, for the equivalent circuits shown in FIGS. 4(a) and (d), the equivalent resistance of the channel for flow of the discharge current is equal to the resistance of a transistor connected parallel to a set of four transistors connected in series. Suppose the conductive resistance of each transistor is R, the equivalent resistance in this case is 0.8 R. Also, in the equivalent circuit shown in FIGS. 4(b) and (c), the equivalent resistance of the flow channel for the discharge current is equal to the resistance of the set of two transistors connected in series and the set of three transistors connected in series with the two sets connected parallel to each other. In this case, suppose the conductive resistance of each transistor is R, the equivalent resistance is 1.2 R.

That is, the equivalent resistance of the flow channel for the discharge current in the read mode for any bit line is kept equal or similar, so that it is possible to inhibit variation in the equivalent resistance of the flow channel for the discharge current corresponding to the configuration position of the read bit line, and it is possible to improve the stability of the reading operation.

As explained in the above, in this embodiment, a memory cell array is formed by setting multiple ROM memory cells in a matrix configuration with memory data coded corresponding to the presence/absence of via contacts between different metal wiring layers. The memory cells of the same row are connected to a single word line, and the memory cells of the same column are connected to a single bit line. In addition, transistors, the gates of which are connected to the word line corresponding to the row and each diffusion layer of which connected to the adjacent one, are set in each memory cell row. In the read mode, the selected bit line is precharged to a prescribed potential, and the selected word line is set in the active state, so that the various transistors on the selected row are set in the conductive state. The bit line potential is set corresponding to the presence/absence of the via contacts of the selected memory cell, and the memory data of the selected memory cells are read corresponding to the bit line potential. Consequently, in the read mode, it is possible to perform reading at a high speed and with a high stability. In addition, by adopting the via contact method, it is possible to shorten the manufacturing cycle time.

Embodiment 2

Figure 5:
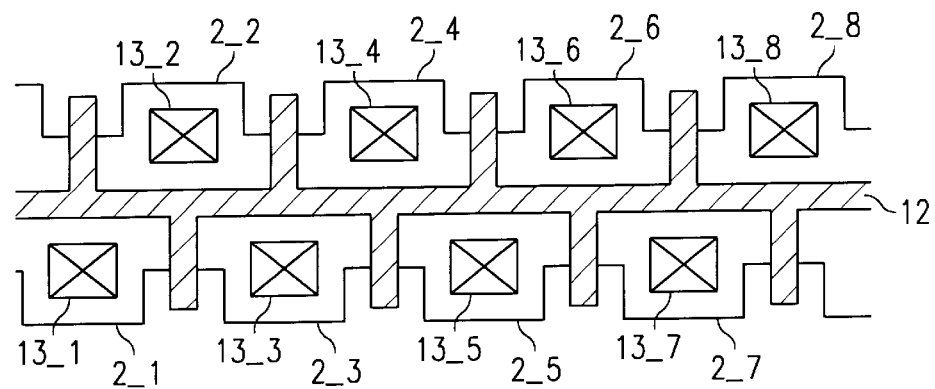
FIG. 5 is a circuit diagram illustrating Embodiment 2 of the mask ROM in this invention.

FIG. 5 is a diagram illustrating Embodiment 2 of the mask ROM in this invention. It illustrates the layout of mask ROM.

In FIG. 5, 2-1, 2-2, 2-3, 2-4, 2-5, 2-6, 2-7, and 2-8 represent $n^+$ diffusion layers; 12 represents a polysilicon layer; 13-1, 13-2, 13-3, 13-4, 13-4, 13-5, 13-6, 13-7, and 13-8 represent contact holes.

$n^+$ diffusion layers 2-1, 2-2, 2-3, 2-4, 2-5, 2-6, 2-7, and 2-8 are formed on a principal surface of the substrate. In addition, on said $n^+$ diffusion layers, contact holes 13-1, 13-2, 13-3, 13-4, 13-5, 13-6, 13-7, and 13-8 are formed.

A via is formed in each of contact holes 13-1, 13-2, 13-3, 13-4, 13-5, 13-6, 13-7, and 13-8. $n^+$ diffusion layers are connected through said vias to first metal wiring layer (not shown in the figure) formed on polysilicon layer (12).

Also, second metal wiring layer is formed on first metal wiring layer. Also, corresponding to the structure and manufacturing step of the peripheral circuit of the mask ROM, a third metal wiring layer may be formed on said second metal wiring layer.

Polysilicon layer (12) forms the word lines. By means of the second and third metal wiring layers formed on it, the bit lines are formed. Data coding is performed corresponding to the presence/absence of vias formed between the metal wiring layer that forms the bit lines and the first metal wiring layer.

Figure 6:
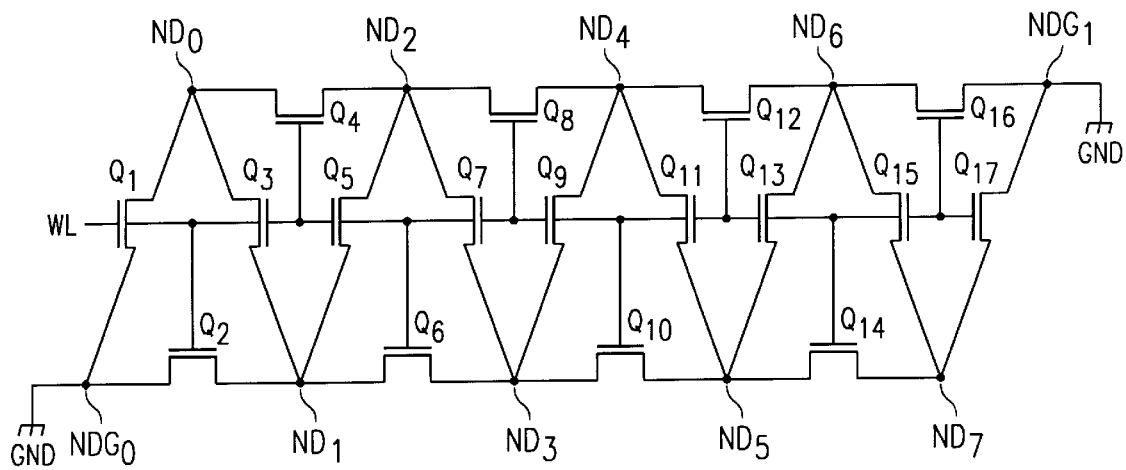
FIG. 6 is an equivalent circuit diagram illustrating Embodiment 2.
Figure 7:
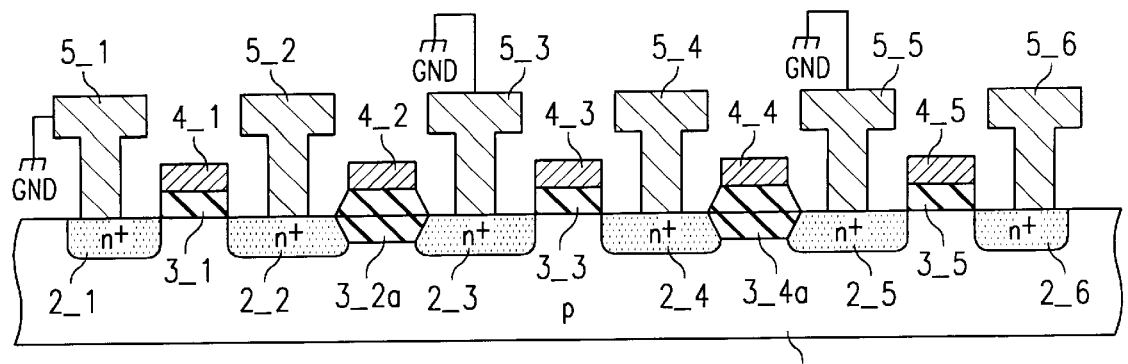
FIG. 7 is a schematic cross-sectional view illustrating the structure of a conventional diffusion type mask ROM.

FIG. 6 illustrate the equivalent circuit of the mask ROM shown in FIG. 5.

As shown in the figure, the mask ROM shown in FIG. 5 is represented equivalently by a circuit made of multiple-transistors Q1–Q17 connected among multiplenodes ND0–ND7 set among multiplenodes ND0–ND7 set between ground nodes NDG0–NDG1.

Transistors are connected between nodes. For example, transistor Q1 is connected between ground node NDG0 and node ND0; transistor Q2 is connected between ground node NDG0 and node ND1; and transistor Q3 is connected between node ND0 and node ND1.

Similarly, transistors are connected between the other adjacent nodes. In addition, gates of these transistors Q1–Q17 are connected to word line WL.

Consequently, control is performed on the ON/OFF state of all of the transistors corresponding to the potential of word line WL. When these transistors are kept in the ON state, nodes ND0-ND7 are kept at the same potential as that of ground nodes NDG0 and NDG1, that is, they are kept at ground potential GND.

Also, in the equivalent circuit of FIG. 6, word line WL has a configuration made of polysilicon (12) in the layout diagram illustrated in FIG. 5. For example, the nodes containing ground nodes NDG0 and NDG1 are made of the contact holes shown in FIG. 5.

That is, in the equivalent circuit shown in FIG. 6, nodes ND0–ND7 are connected through vias to the bit lines, respectively.

The reading operation of the mask ROM in this embodiment is similar to that of mask ROM in Embodiment 1 of this invention explained in the above. The following is a brief account of it.

In the read mode, first of all, the selected bit line is precharged to the prescribed potential. On the other hand, the unselected bit lines are kept at a potential lower than the precharge potential, such as ground potential GND. Then, a high-level voltage, such as power source voltage Vcc, is applied to the selected word line. As all of the multipletransistors connected to the selected word line are kept in the ON state, the node to which the selected memory cell is connected is kept at ground potential.

In the memory cells, via contacts are formed corresponding to the memory data in the coding operation step as explained above. Consequently, the corresponding bit line potential is set. For example, when a via contact is formed at the selected memory cell, as the selected bit line is connected to the ground potential GND through the via contact, the selected bit line is discharged, and is kept at, say, ground potential GND. On the other hand, when a via contact is not formed at the selected memory cell, the selected bit line is not discharged, and the bit line potential is kept nearly at the precharge potential.

By means of the sense amplifier connected to the bit line, the bit line potential is detected, and, corresponding to the detection result, the memory data of the selected memory cell are read.

As explained in the above, according to this embodiment, transistors are formed between adjacent nodes in the multiplenodes set among ground nodes. The gates of these transistors are commonly connected to a single word line, and, except the aforementioned grounded node, the nodes are connected through memory cells to the bit lines. As the via contact is formed corresponding to the memory data for each memory cell, in the read mode, the potential of the selected bit line is set corresponding to the presence/absence of the via contact in the selected memory cell, and the memory data of the selected memory cell can be read corresponding to the bit line potential.

Just as in Embodiment 1 of this invention, in this embodiment, a mask ROM is manufactured using the contact or via contact method, and shortening of the manufacturing cycle time is sought. Also, in this embodiment, efforts are made to construct the layout of the memory cells, so that the degree of integration can be increased. For example, it is possible to realize a mask ROM having nearly the same degree of integration as that of the conventional diffusion layer type memory cells.

In addition, as can be seen from the equivalent circuit shown in FIG. 6, in the mask ROM of this embodiment, multiplepaths are formed between the node connected to the selected memory cell and the ground node in the read mode. Consequently, the equivalent resistance when the selected bit line is discharged can be reduced, and discharge can be performed at a higher rate for the bit lines. As a result, the reading speed can be increased.

As multipletransistors are connected to a single word line, in the read mode, the load on the word line seems to be higher than that in the case of the conventional contact or via contact type mask ROM. However, it is possible to solve this problem by raising the driving power of the word line driver correspondingly. Also, as the selected word line is the only word line driven at the same time for the word line driver in the read mode, by making efforts to improve the structure of the memory cell array, it is possible to suppress the increase in the load on the word line only somewhat.

As explained in the above, for the mask ROM of this invention, as contact or via contact method is adopted, the manufacturing cycle time can be shortened significantly than the conventional diffusion method.

In addition, according to this invention, it is possible to increase the degree of integration of the mask ROM, and it is possible to form the mask ROM with nearly the same area as the mask ROM of the conventional diffusion method. That is, it is possible to reduce the area of the memory chip and to cut the cost.

I claim:

1. A type of mask ROM having memory cells which store prescribed data depending on whether contact is formed between first and second nodes, and which set the bit line potential corresponding to the presence/absence of said contact during the reading process so that the memory data are read corresponding to said bit line potential; comprising:
    a memory cell array having multiple memory cells set in an array configuration,
    multiplebit lines wired to the columns of said memory cell array, respectively,
    multipleword lines wired to the rows of said memory cell array, respectively,
    and multipletransistors which have their control electrodes connected to said word lines, respectively, and which are connected in series between prescribed potentials for said word lines, respectively, to control the ON/OFF state corresponding to said word line potential;
    the diffusion layers of adjacent transistors being connected to a common connecting node; the connecting node being connected to said first node of each said memory cell; said second node of said memory cell being connected to said bit line wired for each column of said memory cell array.

2. The mask ROM described in claim 1 wherein said word lines are formed from a polysilicon layer, and said bit lines are formed from a metal wiring layer formed on said polysilicon layer.

3. The mask ROM described in claim 2 wherein contact is formed between said metal wiring layer and said connecting node of each said transistor corresponding to the memory data of each said memory cell.

4. The mask ROM described in claim 1 wherein said word lines are formed from a polysilicon layer; first and second metal wiring layers are formed respectively on said polysilicon layer; contact is formed between said first metal wiring layer and said connecting nodes of said transistors; and said bit lines are formed from said second metal wiring layer.

5. The mask ROM described in claim 4 wherein contact is formed between said first metal wiring layer and said second metal wiring layer corresponding to the memory data of said memory cells.

6. The mask ROM described in claim 1 wherein said word lines are formed from a polysilicon layer; first, second, and third metal wiring layers are formed respectively on said polysilicon layer; contact is formed between said first metal wiring layer and said connecting nodes of said transistors; and said bit lines are formed from said third metal wiring layer.

7. The mask ROM described in claim 6 wherein corresponding to the memory data of said memory cells, contact is formed between said first metal wiring layer and said second metal wiring layer, and between said second metal wiring layer and said third metal wiring layer.

8. The mask ROM described in claim 1 wherein the transistors at the two ends of transistors connected in series and set for each row of said memory cell array are connected to a common potential.

9. The mask ROM described in claim 1 wherein during the reading process, the selected bit line is kept at a prescribed precharge potential, and the unselected bit line is kept at ground potential.

10. The mask ROM described in claim 9 wherein during the reading process, said unselected bit line is kept at a common potential.

11. The mask ROM described in claim 1 wherein during the reading process, the selected bit line is kept at a potential which enables conduction of the transistor that has its control electrode connected to the selected word line, and the unselected bit line is kept at ground potential.

12. The mask ROM described in claim 11 wherein during the reading process, said unselected bit line is kept at a common potential.

13. A type of mask ROM having memory cells which store prescribed data depending on whether contact is formed between first and second potential setting nodes, and which set the bit line potential corresponding to the presence/absence of said contact during the reading process so that the memory data are read corresponding to said bit line potential; the mask ROM comprising:

N (N is an integer other than 0) nodes are set in two columns between the first and second potential setting nodes; multipletransistors are set between adjacent nodes of the same column or between said two columns;

memory cell rows are made of word lines connected commonly to the control electrodes of said transistors;

said first and second potential setting nodes are connected to a common potential; said N nodes are connected to said first nodes of said N memory cells; and said second nodes of said memory cells are connected to N bit lines, respectively.

14. The mask ROM described in claim 13 wherein multiple memory cell rows are set, and said first node of the ith (i=1, 2, . . . N) memory cell of each memory cell row is connected to the ith bit line.

15. The mask ROM described in claim 13 wherein said word lines are formed from a polysilicon layer, and said bit lines are formed from a metal wiring layer formed on said polysilicon layer.

* * * * *